United States Patent [19]

Kim

[11] Patent Number: 5,729,895
[45] Date of Patent: Mar. 24, 1998

[54] PROCESS FOR COMPENSATING FOR THE POSITION OF A CAMERA IN A CHIP MOUNT SYSTEM AND PROCESS FOR MOUNTING CHIPS USING THE COMPENSATION METHOD

[75] Inventor: Sung-Woon Kim, Kumee-Shi, Rep. of Korea

[73] Assignee: Daewoo Electronics Co., Ltd., Seoul, Rep. of Korea

[21] Appl. No.: 580,448

[22] Filed: Dec. 27, 1995

[30] Foreign Application Priority Data

Dec. 28, 1994 [KR] Rep. of Korea ............... 94-38228

[51] Int. Cl.[6] ............... H05K 3/32; H05K 13/04; H05K 13/08
[52] U.S. Cl. ............... 29/833; 29/721; 29/740; 29/743; 29/834; 294/64.1; 356/394; 382/151
[58] Field of Search ............... 29/712, 721, 740, 29/741, 743, 759, 832, 833, 834, 836; 294/2, 64.1; 356/394; 382/151, 287; 414/737

[56] References Cited

U.S. PATENT DOCUMENTS

| | | | |
|---|---|---|---|
| 4,978,224 | 12/1990 | Kishimoto et al. | 356/394 |
| 5,060,366 | 10/1991 | Asai et al. | 29/740 X |
| 5,224,325 | 7/1993 | Takahashi et al. | 29/834 X |
| 5,237,622 | 8/1993 | Howell | 382/151 |
| 5,331,731 | 7/1994 | Suzuki et al. | 29/743 X |
| 5,383,270 | 1/1995 | Iwatsuka et al. | 29/721 X |
| 5,384,956 | 1/1995 | Sakurai et al. | 29/834 |
| 5,570,993 | 11/1996 | Onodera et al. | 29/743 X |

FOREIGN PATENT DOCUMENTS

| | | | |
|---|---|---|---|
| 416878 | 3/1991 | European Pat. Off. | 29/740 |
| 292328 | 12/1987 | Japan | 29/740 |
| 160794 | 7/1991 | Japan | 29/740 |
| 53300 | 2/1992 | Japan | 29/834 |

*Primary Examiner*—Peter Vo
*Attorney, Agent, or Firm*—Beveridge, DeGrandi, Weilacher & Young LLP

[57] ABSTRACT

Disclosed is a process for mounting chips exactly on a PCB without making a camera coordinate system coincide with a table coordinate system of a rotary-type chip mount system. The process comprises the steps of reading positional difference and angular difference between a camera coordinate system and a table coordinate system as values in the camera coordinate system by means of a jig nozzle, transforming the values to those of the table coordinate system, and using the transformed values as compensation data when mounting chips on PCB.

23 Claims, 6 Drawing Sheets

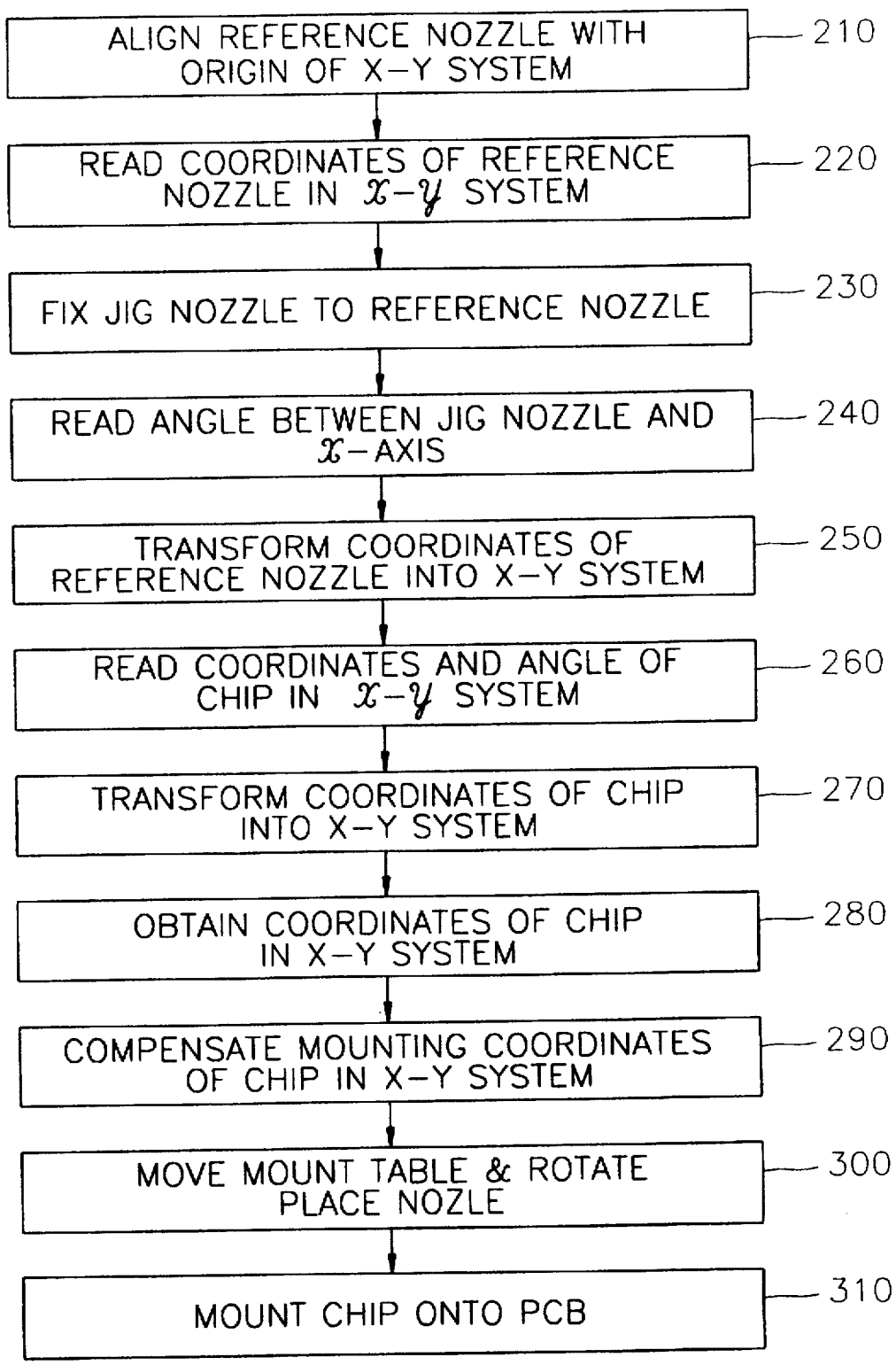

PROCESS FOR COMPENSATING FOR THE POSITION OF A CAMERA IN A CHIP MOUNT SYSTEM AND PROCESS FOR MOUNTING CHIPS USING THE COMPENSATION METHOD

BACKGROUND OF THE INVENTION

1. Field of the Invention

The present invention relates to a process for mounting chips on a printed circuit board by a rotary-type chip mount system, and more particularly to a process for compensating positional difference between a camera coordinate system and a table coordinate system of the chip mount system by means of a jig nozzle and a process for mounting chips on a printed circuit board using the compensation process.

2. Prior Arts

A chip mount system is an appliance for mounting chips on a printed circuit board.

FIG. 1 is a schematic constructional view of a rotary-type chip mount system 100. Rotary-type chip mount system 100 includes a supply tray 120, a mount table 130 for carrying a printed circuit board (PCB) 160, twelve rotary heads 110 rotating between supply tray 120 and mount table 130 as an arrow in FIG. 1, and a charge-coupled device (CCD) camera 140. Supply tray 120 conveys chips 180 mounted thereon according to a predetermined order in X direction of FIG. 1. Each rotary head 110 has four place nozzles 112 spaced apart from each other with a regular angular interval of ninety degree, as shown in FIG. 2.

Rotary heads 110 travels along twelve stations S1 through S12, and chip mount system 100 performs a corresponding predetermined function when each rotary head 110 is located at each station.

When each rotary head 110 is located at first station S1, one of four place nozzles 112 of rotary head 110 sucks a chip 180 from supply tray 120. When rotary head 110 is located at second station S2, it is detected if one of place nozzles 112 is sucking chip 180. When rotary head 110 is located at third station S3, CCD camera 140 takes a photograph of chip 180 sucked by place nozzle 112 and identifies coordinates of chip 180 and an angle of chip 180 with respect to X-axis in camera coordinate system (X-Y).

When each rotary head 110 is located at fifth station S5, place nozzle 112 is rotated with the angle of chip 180 with respect to X-axis. While rotary head 110 is moving from sixth station S6 to seventh station S7, mount table 130 moves so as to accord the coordinates of chip 180 identified by CCD camera 140 with a predetermined mount position of chip 180 on PCB 160.

When rotary head 110 is located at seventh station S7, rotary head 110 mounts chip 180 onto PCB 160 on mount table 130. When rotary head 110 is located at ninth station S9 without mounting chip 180 on PCB 160 at seventh station S7, rotary head 110 throws away chip 180 from place nozzle 112.

When rotary head 110 is located at eleventh station S11, place nozzle 112 having rotated at fifth station S5 returns to its initial position.

In rotary-type chip mount system 100 performing the above-described precess, when rotary head 110 is located at fifth S5, place nozzle 112 rotates. While rotary head 110 is moving from sixth station S6 to seventh station S7, mount table 130 moves to the coordinates of chip 180 identified by CCD camera 140. Therefore, camera coordinate system (X-Y) must exactly coincide with table coordinate system (X-Y).

To coincide camera coordinate system (X-Y) and table coordinate system (X-Y) with each other, CCD camera 140 must be installed in chip mount system 100 as follows.

Firstly, an installer sets one of place nozzles 112 as reference nozzle 112a, and accords the center of reference nozzle 112a with the origin of table coordinate system (X-Y). Then, he moves reference nozzle 112a to third station S3, accords the origin of camera coordinate system (X-Y) with the center of reference nozzle 112a, and adjusts CCD camera 140 so that distances from the origin of camera coordinate system (X-Y) to two centers of two place nozzles 112 adjacent to reference nozzle 112a may be equal to each other and that distances from the two centers of two place nozzles 112 to X-axis may be equal to each other. The installer installs CCD camera 140 in chip mount system 100 while maintaining the above-described adjustments.

In such a process of installing CCD camera 140 in chip mount system 100, the installer must watch the monitor of CCD camera 140 to maintain the above-described adjustments while installing CCD camera 140 in chip mount system 100. Therefore, the exactness of the coincidence between camera coordinate system (X-Y) and table coordinate system (X-Y) depends just on the installer's sight and handling. Accordingly, it is highly probable that there is a great slip or disaccord between camera coordinate system (X-Y) and table coordinate system (X-Y), and thereby chip mount system 100 can not mount chips 180 exactly on PCB 160 or fails to mount chips 180 on PCB 160.

Several patents including U.S. Pat. No. 5,237,622 issued to Howell and U.S. Pat. No. 4,978,224 issued to Kishimoto et al. disclose chip mount systems in which chip components are mounted on PCB using cameras or the mounted states of the chip components are inspected. However, the chip mount systems in the above patents does not disclose a process for compensating the positional difference between the camera coordinate system and the table coordinate system.

SUMMARY OF THE INVENTION

The present invention has been made to overcome the above described problems of the prior arts, and accordingly it is an object of the present invention to provide a process for compensating positional difference between a camera coordinate system and a table coordinate system of the chip mount system so as to exactly mount chips on a printed circuit board without making the two coordinate systems coincide with each other.

It is another object of the present invention to provide a process for mounting chips exactly on a printed circuit board without making a camera coordinate system coincide with a table coordinate system of a rotary-type chip mount system.

To achieve the above object, the present invention provides a process for compensating a positional difference between a camera coordinate system and a table coordinate system in a rotary-type chip mount system, the rotary-type chip mount system including a supply tray for supplying chips, a mount table for carrying a printed circuit board, a plurality of rotary heads rotating between the supply tray and the mount table, and a camera for identifying the chips, each of the plurality of rotary heads having a plurality of place nozzles, the mount table having the table coordinate system, the camera having the camera coordinate system and identifying the chips in the camera coordinate system, the place nozzles sucking the chips from the supply tray and mounting the chips onto the printed circuit board, the process comprising the steps of:

(1) selecting a first place nozzle from the place nozzles as a reference nozzle and aligning a center of the reference nozzle with an origin of the table coordinate system;

(2) reading first coordinates (X0, Y0) of the center of the reference nozzle in the camera coordinate system;

(3) identifying an angle θ0 between an X-axis of the table coordinate system and an X-axis of the camera coordinate system using a jig nozzle;

(4) obtaining a positional difference between an origin of the camera coordinate system and the origin of the table coordinate system as second coordinates (X0, Y0) in the table coordinate system using the first coordinates (X0 ,Y0), the angle θ0, and an equation which is $$\begin{bmatrix} X_0 \\ Y_0 \end{bmatrix} = - \begin{bmatrix} \cos\theta_0 + \sin\theta_0 \\ -\sin\theta_0 + \cos\theta_0 \end{bmatrix} \begin{bmatrix} x_0 \\ y_0 \end{bmatrix};$$

and (5) providing the chip mount system with the second coordinates (X0, Y0) and angle θ0 as compensation values for the positional difference between the camera coordinate system and table coordinate system.

According to another embodiment, the present invention provides a process for for mounting chips on a printed circuit board in a rotary-type chip mount system, the rotary-type chip mount system including a supply tray for supplying chips, a mount table for carrying a printed circuit board, a plurality of rotary heads rotating between the supply tray and the mount table, and a camera for identifying the chips, each of the plurality of rotary heads having a plurality of place nozzles, the mount table having a table coordinate system, the camera having a camera coordinate system and identifying the chips in the camera coordinate system, the place nozzles sucking the chips from the supply tray and mounting the chips onto the printed circuit board, the process comprising the steps of:

(1) selecting a first place nozzle from the place nozzles as a reference nozzle and aligning a center of the reference nozzle with an origin of the table coordinate system;

(2) reading first difference coordinates (X0, Y0) of the center of the reference nozzle in the camera coordinate system;

(3) identifying a first angle θ0 between an X-axis of the table coordinate system and an X-axis of the camera coordinate system using a jig nozzle;

(4) obtaining a positional difference between an origin of the camera coordinate system and the origin of the table coordinate system as second difference coordinates (X0, Y0) in the table coordinate system using the first difference coordinates (X0, Y0), the first angle θ0, and a first equation, $$\begin{bmatrix} X_0 \\ Y_0 \end{bmatrix} = - \begin{bmatrix} \cos\theta_0 + \sin\theta_0 \\ -\sin\theta_0 + \cos\theta_0 \end{bmatrix} \begin{bmatrix} x_0 \\ y_0 \end{bmatrix}$$

(5) identifying first chip coordinates (X1, Y1) of one of the chips and a second angle θP of said one of the chips with respect to the X-axis in the camera coordinate system, said one of the chips being sucked by a second place nozzle of the place nozzles;

(6) transforming the first chip coordinates (X1, Y1) into second chip coordinates (X1, Y1) by means of a second equation, $$\begin{bmatrix} X_1 \\ Y_1 \end{bmatrix} = \begin{bmatrix} \cos\theta_0 + \sin\theta_0 \\ -\sin\theta_0 + \cos\theta_0 \end{bmatrix} \begin{bmatrix} x_1 \\ y_1 \end{bmatrix};$$

(7) obtaining third coordinates (Xc, Yc) of said one of the chips in the table coordinate system by means of the second difference coordinates (X0, Y0), the second chip coordinates (X1, Y1), and a third equation, $$\begin{bmatrix} X_c \\ Y_c \end{bmatrix} = \begin{bmatrix} \cos\theta_0 + \sin\theta_0 \\ -\sin\theta_0 + \cos\theta_0 \end{bmatrix} \begin{bmatrix} x_1 \\ y_1 \end{bmatrix} - \begin{bmatrix} \cos\theta_0 + \sin\theta_0 \\ -\sin\theta_0 + \cos\theta_0 \end{bmatrix} \begin{bmatrix} x_0 \\ y_0 \end{bmatrix};$$

(8) obtaining distance coordinates (ΔX, ΔY) of the mount table by subtracting the third chip coordinates (Xc,Yc) from mount coordinates (Xm, Ym), and obtaining a rotation angle (Δθ) by subtracting the first angle (θ0) from the second angle (θP), the mount coordinates (Xm, Ym) being coordinates of a predetermined position on which said one of the chip is to be mounted in the table coordinate system; and (9) moving the mount table to the distance coordinates (ΔX, ΔY) in the table coordinate system, and rotating the second place nozzle with the rotation angle (Δθ), and then mounting said one of the chips onto the predetermined position on the printed circuit board.

BRIEF DESCRIPTION OF THE DRAWINGS

The above object, and other features and advantages of the present invention will become more apparent by describing in detail preferred embodiments thereof with reference to the attached drawings, in which:

FIG. 10 is a flow chart for describing the process for mounting the chips on PCB according to the present invention as shown in FIG. 9.

DESCRIPTION OF THE PREFERRED EMBODIMENTS

A preferred embodiment of the present invention will be described in detail with reference to the accompanying drawings.

Figure 1:
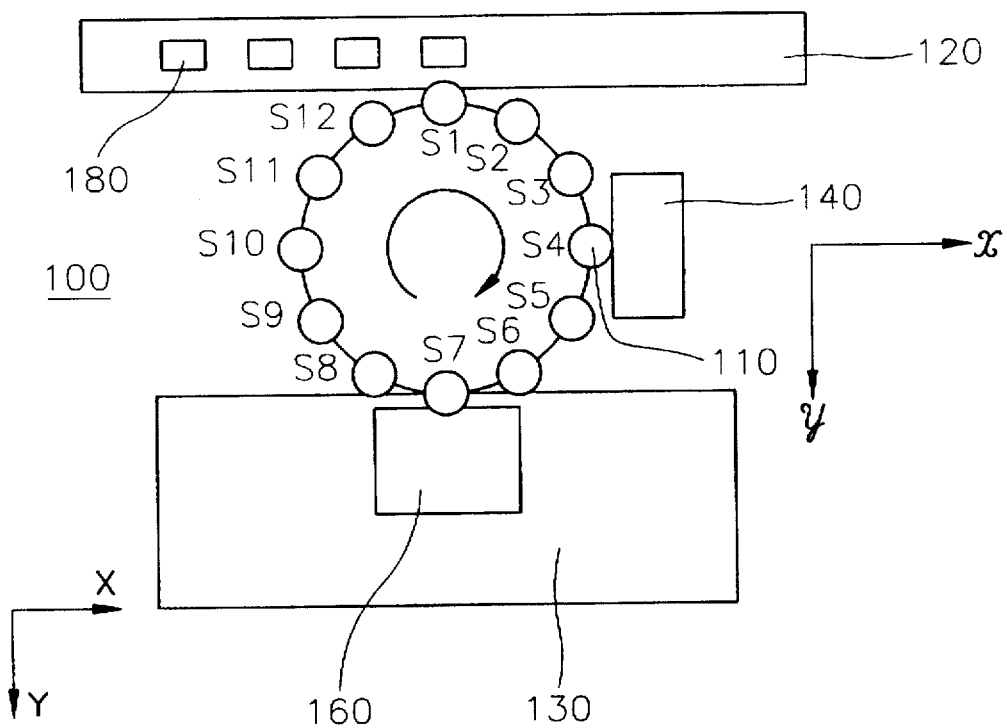
FIG. 1 is a schematic constructional view of a rotary-type chip mount system.

Referring to FIG. 1, a chip mount system 100 includes a supply tray 120 for supplying chips 180, a mount table 130 for carrying a PCB 160, twelve rotary heads 110 rotating between supply tray 120 and mount table 130, and a charge-coupled device (CCD) camera 140 for identifying chip components chip 180.

Supply tray 120 conveys chips 180 mounted thereon according to a predetermined order in X direction of FIG. 1.

Figure 2:
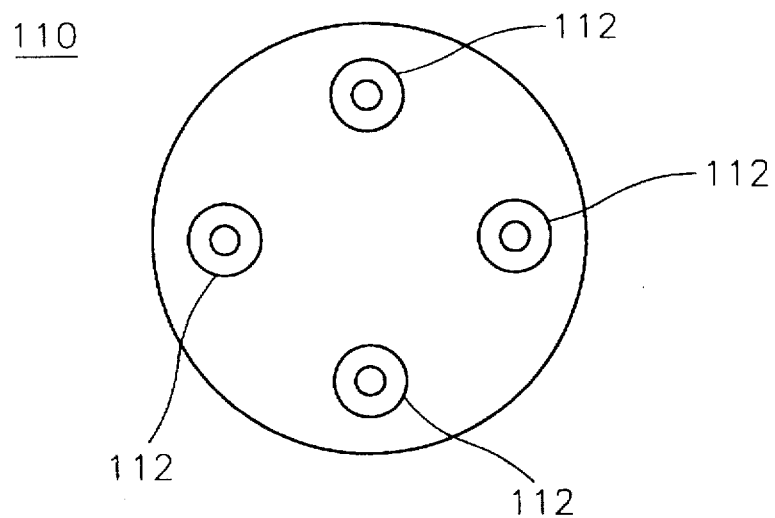
FIG. 2 is a bottom view of a rotary head shown in FIG. 1.

Each rotary head 110 has four place nozzles 112 spaced apart from each other with a regular angular interval of ninety degree, as shown in FIG. 2. Each place nozzle 112 sucks chip 180 by means of vacuum pressure.

Figure 3:
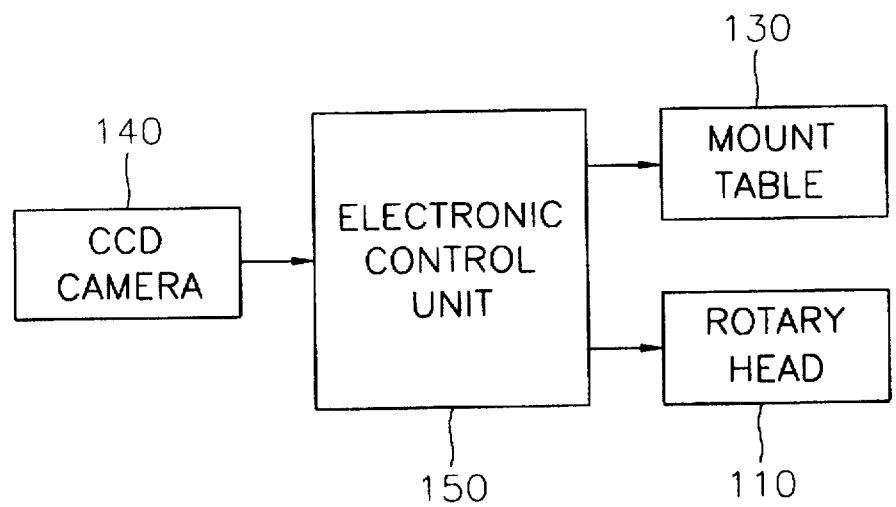
FIG. 3 is a schematic block diagram of a control section in the rotary-type chip mount system shown in FIG. 1.
Figure 4:
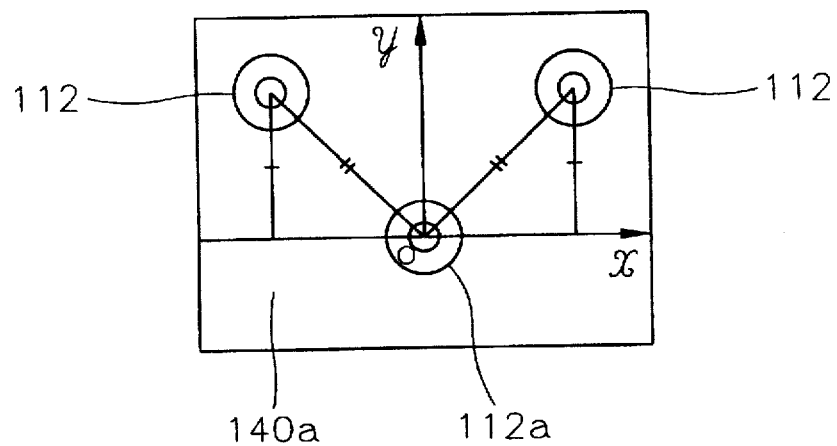
FIG. 4 is a schematic view of a monitor of a CCD camera for describing a conventional process for installing the CCD camera in the rotary-type chip mount system shown in FIG. 1.
Figure 5:
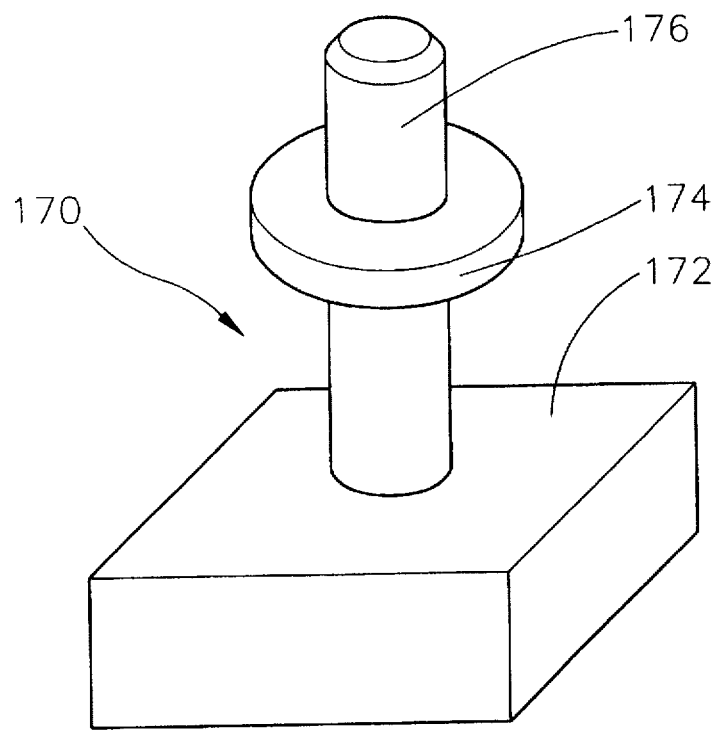
FIG. 5 is a perspective view of a jig nozzle used in a process for compensating position of a camera according to the present invention.

Meanwhile, chip mount system 100 has an Electronic control unit (ECU) 150 as shown in FIG. 3. ECU 150 moves mount table 130 with a predetermined distance and angle based on data from CCD camera 140, and it controls suction of chips 180 from supply tray 120 by rotary head 110 and mounting of chips 180 on PCB 160.

Rotary heads 110 travels along twelve stations S1 through S12 as shown in FIG. 1. Rotary head 110 performs a corresponding predetermined function when each rotary head 110 is located at each station.

That is, when each rotary head 110 is located at first station S1, one of four place nozzles 112 of rotary head 110 sucks a chip 180 from supply tray 120. When rotary head 110 is located at second station S2, ECU 150 detects if one of place nozzles 112 is sucking chip 180. When rotary head 110 is located at third station S3, CCD camera 140 takes a photograph of chip 180 sucked by place nozzle 112 and it identifies coordinates (X1, Y1) of chip 180 and angle θP of chip 180 with respect to X-axis in camera coordinate system (X-Y).

When each rotary head 110 is located at fifth station S5, ECU 150 rotates place nozzle 112. While rotary head 110 is moving from sixth station S6 to seventh station S7, ECU 150 moves mount table 130 so as to exactly mount chip 180 on PCB 160 based on coordinates (X1, Y1) of chip 180.

When rotary head 110 is located at seventh station S7, rotary head 110 mounts chip 180 onto PCB 160 on mount table 130. When rotary head 110 is located at ninth station S9 without mounting chip 180 on PCB 160 at seventh station S7, rotary head 110 throws away chip 180 from place nozzle 112 by the control of ECU 150.

When rotary head 110 is located at eleventh station S11, place nozzle 112 having rotated at fifth station S5 returns to its initial position.

According to an embodiment of the present invention, camera coordinate system (X-Y) does not coincide with table coordinate system (X-Y) when CCD camera 140 is installed in chip mount system 100. Instead, the positional difference between camera coordinate system (X-Y) and table coordinate system (X-Y) is calculated after CCD camera 140 is installed in chip mount system 100 by means of a jig nozzle 170 as follows.

At first, a reference nozzle 112a which is selected among the plurality of place nozzles 112 installed at twelve rotary heads 110 is placed at seventh station S7, and then the center of reference nozzle 112a is aligned with the origin of table coordinate system (X-Y). Twelve rotary heads 110 and place nozzles 112 of each rotary head 110 have their specific numbers, and it is preferred that No. 1 place nozzle 112 of No. 1 rotary head 110 is selected as reference nozzle 112a.

Next, reference nozzle 112a is moved to third station S3, and CCD camera 140 reads coordinates (X0, Y0) of the center of reference nozzle 112a in camera coordinate system (X-Y).

Figure 6:
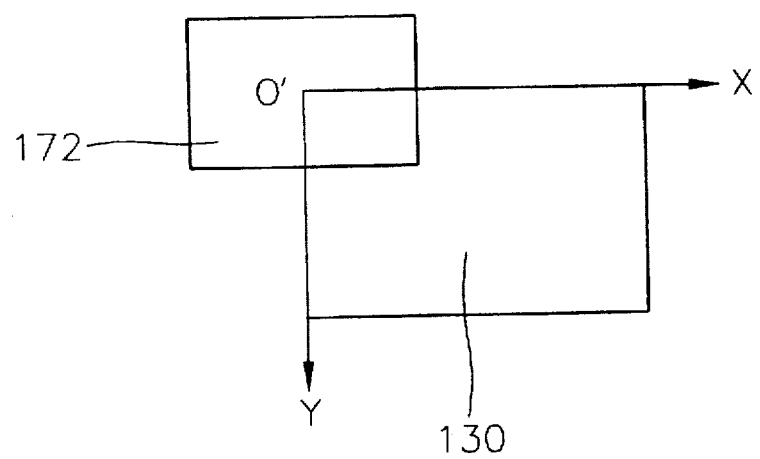
FIG. 6 is a graph for describing the relation between the jig nozzle shown in FIG. 5 and a table coordinate system.

In the meantime, jig nozzle 170 has a rectangular base 172, an annular ring 174, and an assembling head 176. Assembling head 176 is fixed to reference nozzle 112a when jig nozzle 170 is assembled with reference nozzle 112a. Jig nozzle 170 is so fixed in seventh station S7 that one side of rectangular base 172 is aligned in parallel with X-axis of table coordinate system (X-Y) as shown in FIG. 6.

Figure 7:
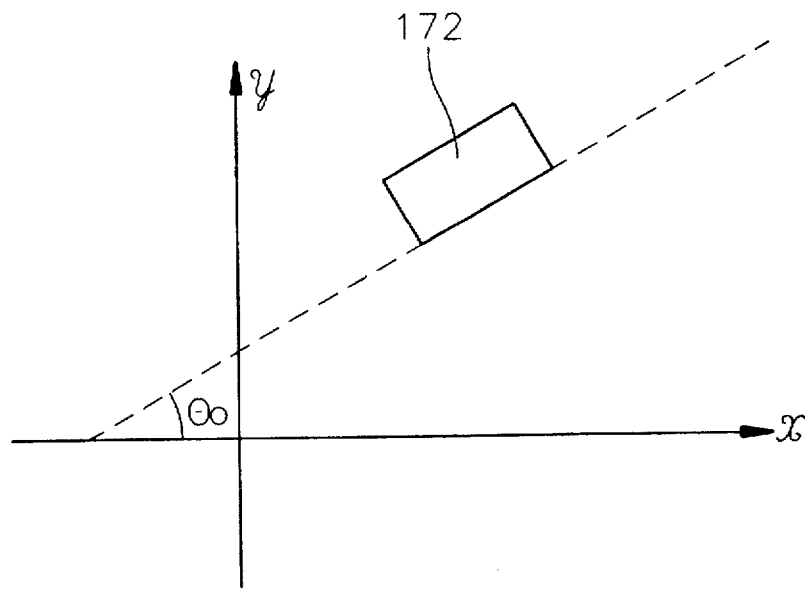
FIG. 7 is a graph for showing position and angle of jig nozzle shown in FIG. 5 in a camera coordinate system.

Then, jig nozzle 170 is moved to third station S3, and CCD camera 140 reads angle θ0 between jig nozzle 170 and X-axis of camera coordinate system (X-Y) as shown in FIG. 7. In this case, angle θ0 represents the angle between X-axis of table coordinate system (X-Y) and X-axis of camera coordinate system (X-Y).

Coordinates (X0, Y0) of the center of reference nozzle 112a in camera coordinate system (X-Y) and angle θ0 between X-axis of table coordinate system (X-Y) and X-axis of camera coordinate system (X-Y) obtained by the above-described process are transmitted as data to ECU 150. ECU 150 transforms the positional difference between the origins of camera coordinate system (X-Y) and table coordinate system (X-Y) to a coordinates (X0, Y0) in table coordinate system (X-Y) by means of the data. In this case, value (X0, Y0) is obtained as follows.

$$X0 = -X0 \cos θ0 - Y0 \sin θ0$$

$$Y0 = X0 \sin θ0 - Y0 \cos θ0.$$

Figure 8:
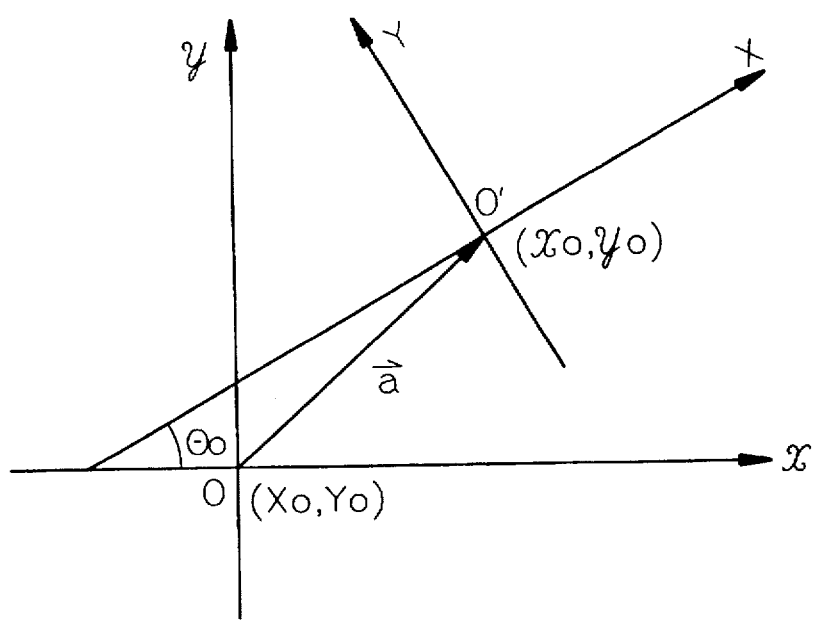
FIG. 8 is a graph for describing the relation between the camera coordinate system and the table coordinate system.

Hereinafter, the process for obtaining value (X0, Y0) will be described in detail. As shown in FIG. 8, the positional difference between the origins of camera coordinate system (X-Y) and table coordinate system (X-Y) is expressed as a vector $\bar{a}$, which is a value in camera coordinate system (X-Y), as follows.

$$\bar{a} = \begin{bmatrix} x_0 \\ y_0 \end{bmatrix}$$

If $\bar{a}$ is transformed into coordinates (X0, Y0) in table coordinate system (X-Y), $$\begin{bmatrix} X_0 \\ Y_0 \end{bmatrix} = -\bar{a} = -\begin{bmatrix} \cos θ_0 + \sin θ_0 \\ -\sin θ_0 + \cos θ_0 \end{bmatrix} \begin{bmatrix} x_0 \\ y_0 \end{bmatrix}, \text{ and thereby}$$

$$\begin{bmatrix} X_0 \\ Y_0 \end{bmatrix} = -\begin{bmatrix} \cos θ_0 + \sin θ_0 \\ -\sin θ_0 + \cos θ_0 \end{bmatrix} \begin{bmatrix} x_0 \\ y_0 \end{bmatrix}$$

That is, $$X0 = X0 \cos θ0 - Y0 \sin θ0$$

$$Y0 = X0 \sin θ0 - Y0 \cos θ0.$$

The positional difference between the origins of the two coordinate systems which is obtained as a coordinate value in table coordinate system (X-Y) as described above is stored in ECU 150 and is provided as a positional compensation value between mount table 130 and CCD camera 140 when place nozzle 112 mounts chip 180 onto PCB 160.

Hereinafter, a process for mounting chip 180 exactly onto a required position of PCB 160 by means of the above compensation value between mount table 130 and CCD camera 140 will be described in detail.

As mentioned before, twelve rotary heads 110 travel along twelve stations S1 through S12, and chip mount system 100 performs a corresponding function when rotary head 110 is located at each station.

When chip 180 sucked by place nozzle 112 is located at third station S3, CCD camera 140 identifies coordinates (X1, Y1) of chip 180 and angle θP of chip 180 with respect to X-axis in camera coordinate system (X-Y).

Figure 9:
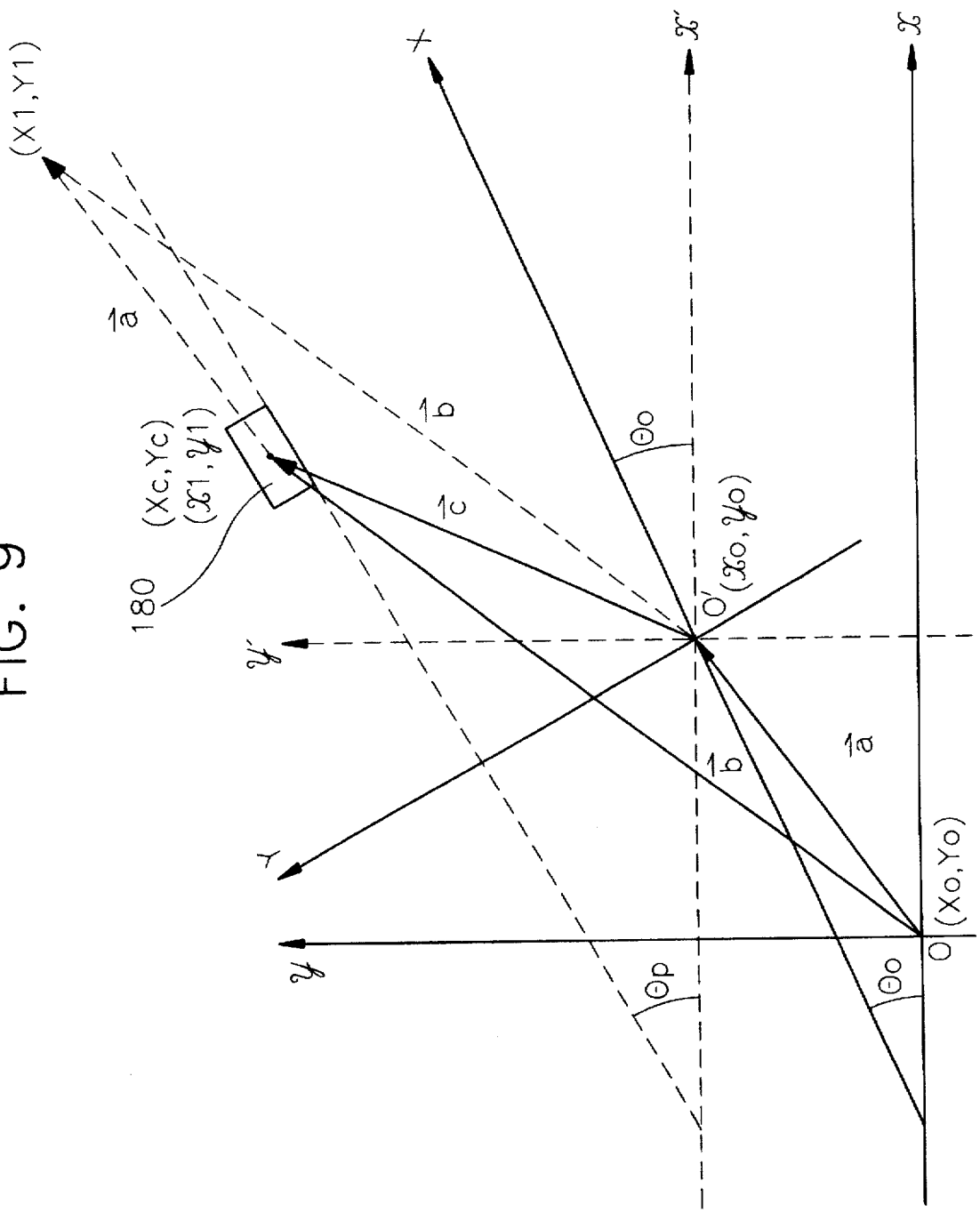
FIG. 9 is a graph for showing coordinates of chips in the camera coordinate system and the table coordinate system and for describing a process for mounting the chips on PCB according to the present invention.

Referring to FIG. 9, coordinates (X1, Y1) of chip 180 in camera coordinate system (X-Y) is represented as a vector $\overline{b}$. That is, $$\overline{b} = \begin{bmatrix} x_1 \\ y_1 \end{bmatrix}$$

In this case, if $\overline{b}$ is transformed into a coordinates (X1, Y1) in table coordinate system (X-Y), $$\overline{b} = \begin{bmatrix} x_1 \\ y_1 \end{bmatrix} = \begin{bmatrix} \cos\theta_0 + \sin\theta_0 \\ -\sin\theta_0 + \cos\theta_0 \end{bmatrix} \begin{bmatrix} x_1 \\ y_1 \end{bmatrix}$$

Meanwhile, coordinates (Xc, Yc) of chip 180 in table coordinate system (X-Y) is represented by a vector $\overline{c}$, and $\overline{c} = \overline{b} - \overline{a}$ as shown in FIG. 9.

Therefore, $$\overline{c} = \begin{bmatrix} x_c \\ y_c \end{bmatrix} = \begin{bmatrix} \cos\theta_0 + \sin\theta_0 \\ -\sin\theta_0 + \cos\theta_0 \end{bmatrix} \begin{bmatrix} x_1 \\ y_1 \end{bmatrix} - \begin{bmatrix} \cos\theta_0 + \sin\theta_0 \\ -\sin\theta_0 + \cos\theta_0 \end{bmatrix} \begin{bmatrix} x_0 \\ y_0 \end{bmatrix}$$

In other words, $c = X1 \cos\theta 0 + Y1 \sin\theta 0 + X0$ and $Yc = -X1 \sin\theta 0 + Y1 \cos\theta 0 + Y0$, or $Xc = (X1-X0) \cos\theta 0 + (Y1-Y0) \sin\theta 0$ and $Yc = (Y1-Y0) \cos\theta 0 + (X1-X0) \sin\theta 0$.

In the meantime, an angle Δθ which chip 180 makes with X-axis of table coordinate system (X-Y) is estimated by an equation, that is, $\Delta\theta = \theta P - \theta 0$.

In this case, coordinates (Xc, Yc) and angle Δθ are respectively coordinates of chip 180 in table coordinate system (X-Y) and angle of chip 180 to X-axis, and at the same time they are compensation values for the positional difference between camera coordinate system (X-Y) and table coordinate system (X-Y) and for positional deviation of chip 180 sucked on place nozzle 112. Such compensation values are functions of X0, X1, Y0, Y1, θ0, and θP, which are readable on camera coordinate system (X-Y). Therefore, the compensation values are easily obtained only through identification of chip 180 by CCD camera 140.

Meanwhile, if P(Xm, Ym) is coordinates of a predetermined mounting position of chip 180 in table coordinate system (X-Y), ΔX=Xm−Xc, and ΔY=Ym−Yc.

Therefore: the distances in X-direction and Y-direction that mount table 130 must move in order to mount chip 180 on an exact position of PCB 160 are respectively ΔX and Δy, and the angle that place nozzle 112 must rotate is Δθ.

As described above, when chip 180 sucked by place nozzle 112 is located at fifth station S5, ECU 150 rotates place nozzle 112 with angle Δθ. While chip 180 sucked by place nozzle 112 is moving from sixth station S6 to seventh station S7, ECU 150 moves mount table 130 with distances of ΔX and Δy respectively in X-direction and Y-direction.

Therefore, chip 180 can be exactly mounted on PCB 160 at seventh station S7.

FIG. 10 is a flow chart of a chip mounting process according to the present invention as described above.

Referring to FIG. 10, the center of reference nozzle 112a is firstly aligned with the origin of table coordinate system (X-Y) (step 210).

Next, CCD camera 140 reads coordinates (X0, Y0) of the center of reference nozzle 112a in camera coordinate system (X-Y), that is, $$\overline{a} = \begin{bmatrix} x_0 \\ y_0 \end{bmatrix}$$

(step 220).

Jig nozzle 170 is so fixed to reference nozzle 112a that one side of rectangular base 172 is aligned in parallel with X-axis of table coordinate system (X-Y) (step 230).

Then, CCD camera 140 reads angle θ0 between jig nozzle 170 and X-axis of camera coordinate system (X-Y) (step 240).

Using $$\overline{a} = \begin{bmatrix} x_0 \\ y_0 \end{bmatrix}$$

and θ0, ECU 150 computes the positional difference between the origins of camera coordinate system (X-Y) and table coordinate system (X-Y) as a value (X0, Y0) in table coordinate system (X-Y). In this case, $$\begin{bmatrix} X_0 \\ Y_0 \end{bmatrix} = - \begin{bmatrix} \cos\theta_0 + \sin\theta_0 \\ -\sin\theta_0 + \cos\theta_0 \end{bmatrix} \begin{bmatrix} x_0 \\ y_0 \end{bmatrix} \text{ (step 250).}$$

When chip 180 sucked by place nozzle 112 is located at third station S3, CCD camera 140 identifies coordinates (X1, Y1) of chip 180 and angle θP of chip 180 with respect to X-axis in camera coordinate system (X-Y). In this case, $$\overline{b} = \begin{bmatrix} x_1 \\ y_1 \end{bmatrix} \text{ (step 260).}$$

Then, $\overline{b}$ is transformed into a coordinates (X1, Y1) in table coordinate system (X-Y). That is, $$\begin{bmatrix} X_1 \\ Y_1 \end{bmatrix} = \begin{bmatrix} \cos\theta_0 + \sin\theta_0 \\ -\sin\theta_0 + \cos\theta_0 \end{bmatrix} \begin{bmatrix} x_1 \\ y_1 \end{bmatrix} \text{ (step 270).}$$

Using $\overline{a}$ and $\overline{b}$, ECU 150 obtains coordinates (Xc, Yc) of chip 180 in table coordinate system (X-Y). That is, $\overline{c} = \overline{b} - \overline{a}$, and thereby $$\overline{c} = \begin{bmatrix} x_c \\ y_c \end{bmatrix} =$$

$$\begin{bmatrix} \cos\theta_0 + \sin\theta_0 \\ -\sin\theta_0 + \cos\theta_0 \end{bmatrix} \begin{bmatrix} x_1 \\ y_1 \end{bmatrix} - \begin{bmatrix} \cos\theta_0 + \sin\theta_0 \\ -\sin\theta_0 + \cos\theta_0 \end{bmatrix} \begin{bmatrix} x_0 \\ y_0 \end{bmatrix} \text{ (step 280)}.$$

Using $\overline{c}$, θ0, and θP, ECU 150 computes a compensated angle Δθ which chip 180 makes with X-axis of table coordinate system (X-Y), that is,

Δθ=θP−θ0, and

ECU 150 compensates coordinates (Xm, Ym) of a predetermined mounting position of chip 180 in table coordinate system (X-Y) as follows, ΔX=Xm−Xc, and ΔY=Ym−Yc (step 290).

When chip 180 sucked by place nozzle 112 is located at fifth station S5, ECU 150 rotates place nozzle 112 with angle Δθ, and while chip 180 sucked by place nozzle 112 is moving from sixth station S6 to seventh station S7, ECU 150 moves mount table with distances of ΔX and ΔY respectively in X-direction and Y-direction (step 300).

Place nozzle 112 exactly mounts chip 180 on PCB 160 at seventh station S7 (step 310).

According to the present invention as described above, it is not necessary to make an effort in order to accord camera coordinate system (X-Y) and table coordinate system (X-Y) with each other when installing CCD camera 140 in chip mount system 100.

In addition, the positional difference between camera coordinate system (X-Y) and table coordinate system (X-Y) can be computed in advance by means of data which are readable in camera coordinate system (X-Y) and then provided as a compensation data when chip 180 is mounted on PCB 160. Accordingly, chips 180 can be mounted on an exact required position on PCB 160 regardless of assembling slip which may be happen largely or small while CCD camera 140 is installed in chip mount system 100.

While the present invention has been particularly shown and described with reference to the particular embodiment thereof, it will be understood by those skilled in the art that various changes in form and details may be effected therein without departing from the spirit and scope of the invention as defined by the appended claims.

What is claimed is:

1. A process for compensating for a positional difference between a camera coordinate system and a table coordinate system in a rotary system for mounting chips, the mount system including a supply tray for supplying chips, a mount table for carrying a printed circuit board, a plurality of rotary heads rotating between the supply tray and the mount table, and a camera for identifying the chips, each of the plurality of rotary heads having a plurality of place nozzles, the mount table having a table coordinate system, the camera having a camera coordinate system and identifying the chips in the camera coordinate system, the place nozzles sucking the chips from the supply tray and mounting the chips onto the printed circuit board, the process comprising the steps of:

(1) selecting a first place nozzle from the place nozzles as a reference nozzle and aligning a center of the reference nozzle with an origin of the table coordinate system;

(2) reading first coordinates (X0, Y0) of the center of the reference nozzle in the camera coordinate system;

(3) identifying an angle θ0 between an X-axis of the table coordinate system and an X-axis of the camera coordinate system using a jig nozzle;

(4) obtaining a positional difference between an origin of the camera coordinate system and the origin of the table coordinate system as second coordinates (X0, Y0) in the table coordinate system using the first coordinates (X0, Y0), the angle θ0, and an equation which is $$\begin{bmatrix} X_0 \\ Y_0 \end{bmatrix} = - \begin{bmatrix} \cos\theta_0 + \sin\theta_0 \\ -\sin\theta_0 + \cos\theta_0 \end{bmatrix} \begin{bmatrix} x_0 \\ y_0 \end{bmatrix};$$

and (5) providing the chip mount system with the second coordinates (X0, Y0) and angle θ0 as compensation values for the positional difference between the camera coordinate system and table coordinate system.

2. The process as claimed in claim 1, wherein the chip mount system comprises twelve rotary heads.

3. The process as claimed in claim 2, wherein the rotary heads rotate along twelve stations.

4. The process as claimed in claim 3, wherein, in step 2, the camera reads the first coordinates (X0, Y0) of the center of the reference nozzle when the reference nozzle is located at a third station of the twelve stations, the first coordinates (X0, Y0) being coordinates of the origin of the table coordinate system in the table coordinate system.

5. The process as claimed in claim 3, wherein the jig nozzle comprises a rectangular base, an annular ring, and an assembling head, the assembling head being fixed to the reference nozzle so that one side of the rectangular base is aligned in parallel with the X-axis of the table coordinate system.

6. The process as claimed in claim 5, wherein, in step 3, the camera identifies the angle θ0 by reading an angle between said one side of the jig nozzle and the X-axis of the camera coordinate system when the jig nozzle is located at a third station of the twelve stations.

7. The process as claimed in claim 2, wherein each of the rotary heads comprises four place nozzles spaced apart from each other with regular circumferential intervals.

8. The process as claimed in claim 1 wherein the first place nozzle is a place nozzle of number one provided at a rotary head of number one among the rotary heads.

9. The process as claimed in claim 1, wherein the camera is a charge-coupled device camera.

10. A process for mounting chips on a printed circuit board in a rotary system for mounting chips, the mount system including a supply tray for supplying chips, a mount table for carrying a printed circuit board, a plurality of rotary heads rotating between the supply tray and the mount table, and a camera for identifying the chips, each of the plurality of rotary heads having a plurality of place nozzles, the mount table having a table coordinate system, the camera having a camera coordinate system and identifying the chips in the camera coordinate system, the place nozzles sucking the chips from the supply tray and mounting the chips onto the printed circuit board, the process comprising the steps of:

(1) selecting a first place nozzle from the place nozzles as a reference nozzle and aligning a center of the reference nozzle with an origin of the table coordinate system;

(2) reading first difference coordinates (X0, Y0) of the center of the reference nozzle in the camera coordinate system;

(3) identifying a first angle θ0 between an X-axis of the table coordinate system and an X-axis of the camera coordinate system using a jig nozzle;

(4) obtaining a positional difference between an origin of the camera coordinate system and the origin of the table coordinate system as second difference coordinates (X0, Y0) in the table coordinate system using the first difference coordinates (X0, Y0), the first angle θ0, and a first equation, $$\begin{bmatrix} X_0 \\ Y_0 \end{bmatrix} = -\begin{bmatrix} \cos\theta_0 + \sin\theta_0 \\ -\sin\theta_0 + \cos\theta_0 \end{bmatrix}\begin{bmatrix} x_0 \\ y_0 \end{bmatrix};$$

(5) identifying first chip coordinates (X1, Y1) of one of the chips and a second angle θP of said one of the chips with respect to the X-axis in the camera coordinate system, said one of the chips being sucked by a second place nozzle of the place nozzles;

(6) transforming the first chip coordinates (X1, Y1) into second chip coordinates (X1, Y1) by means of a second equation, $$\begin{bmatrix} X_1 \\ Y_1 \end{bmatrix} = \begin{bmatrix} \cos\theta_0 + \sin\theta_0 \\ -\sin\theta_0 + \cos\theta_0 \end{bmatrix}\begin{bmatrix} x_1 \\ y_1 \end{bmatrix};$$

(7) obtaining third coordinates (Xc, Yc) of said one of the chips in the table coordinate system by means of the second difference coordinates (X0, Y0), the second chip coordinates (X1, Y1), and a third equation, $$\begin{bmatrix} X_c \\ Y_c \end{bmatrix} = \begin{bmatrix} \cos\theta_0 + \sin\theta_0 \\ -\sin\theta_0 + \cos\theta_0 \end{bmatrix}\begin{bmatrix} x_1 \\ y_1 \end{bmatrix} - \begin{bmatrix} \cos\theta_0 + \sin\theta_0 \\ -\sin\theta_0 + \cos\theta_0 \end{bmatrix}\begin{bmatrix} x_0 \\ y_0 \end{bmatrix};$$

(8) obtaining distance coordinates (ΔX, ΔY) of the mount table by subtracting the third chip coordinates (Xc,Yc) from mount coordinates (Xm, Ym), and obtaining a rotation angle (Δθ) by subtracting the first angle (θ0) from the second angle (θP), the mount coordinates (Xm, Ym) being coordinates of a predetermined position on which said one of the chip is to be mounted in the table coordinate system; and (9) moving the mount table to the distance coordinates (ΔX, ΔY) in the table coordinate system, and rotating the second place nozzle with the rotation angle (Δθ), and then mounting said one of the chips onto the predetermined position on the printed circuit board.

11. The process as claimed in claim 10, wherein the chip mount system comprises twelve rotary heads.

12. The process as claimed in claim 11, wherein the rotary heads rotate along twelve stations.

13. The process as claimed in claim 12, wherein, in step 2, the camera reads the first difference coordinates (X0, Y0) of the center of the reference nozzle when the reference nozzle is located at a third station of the twelve stations, the first difference coordinates (X0,Y0) being coordinates of the origin of the table coordinate system in the table coordinate system.

14. The process as claimed in claim 12, wherein the jig nozzle comprises a rectangular base, an annular ring, and an assembling head, the assembling head being fixed to the reference nozzle so that one side of the rectangular base is aligned in parallel with the X-axis of the table coordinate system.

15. The process as claimed in claim 14, wherein, in step 3, the camera identifies the first angle θ0 by reading an angle between said one side of the jig nozzle and the X-axis of the camera coordinate system when the jig nozzle is located at a third station of the twelve stations.

16. The process as claimed in claim 11, wherein each of the rotary heads comprises four place nozzles spaced apart from each other with regular circumferential intervals.

17. The process as claimed in claim 10, wherein the first place nozzle is a place nozzle of number one provided at a rotary head of number one among the rotary heads.

18. The process as claimed in claim 10, wherein the camera is a charge-coupled device camera.

19. The process as claimed in claim 10, wherein step 5 is performed when said one of the chips is located at a third station of the stations.

20. The process as claimed in claim 10, wherein, in step 9, the mount table moves to the distance coordinates (ΔX, ΔY) in the table coordinate system while said one of the chips is travelling from at a sixth station to a seventh station of the stations.

21. The process as claimed in claim 10, wherein, in step 9, the second place nozzle rotates with the rotation angle (Δθ) when said one of the chips is located at a fifth station of the stations.

22. The process as claimed in claim 10, wherein, in step 9, the second place nozzle mounts said one of the chips exactly onto the predetermined position on the lo printed circuit board when said one of the chips is located at a seventh station of the stations.

23. A process for compensating for a positional difference between a camera coordinate system and a table coordinate system in a rotary system for mounting chips, the mount system including a supply tray for supplying chips, a mount table for carrying a printed circuit board, twelve rotary heads rotating between the supply tray and the mount table along twelve stations, and a charge-coupled device camera for identifying the chips, each of the twelve rotary heads having four place nozzles, the mount table having a table coordinate system, the charge-coupled device camera having a camera coordinate system and identifying the chips in the camera coordinate system, the four place nozzles spaced apart from each other with regular circumferential intervals, the place nozzles sucking the chips from the supply tray and mounting the chips onto the printed circuit board, the process comprising the steps of:

(1) selecting a first place nozzle from the place nozzles as a reference nozzle and aligning a center of the reference nozzle with an origin of the table coordinate system;

(2) reading first difference coordinates (X0, Y0) of the center of the reference nozzle in the camera coordinate system by the charge-coupled device camera when the reference nozzle is located at a third station of the twelve stations, the first difference coordinates (X0, Y0) being coordinates of the origin of the table coordinate system in the table coordinate system;

(3) identifying a first angle θ0 between an X-axis of the table coordinate system and an X-axis of the camera coordinate system using a jig nozzle, the jig nozzle including a rectangular base, an annular ring, and an assembling head, the assembling head being fixed to the reference nozzle so that one side of the rectangular base is aligned in parallel with the X-axis of the table coordinate system, the charge-coupled device camera reading an angle between said one side of the jig nozzle and the X-axis of the camera coordinate system when the jig nozzle is located at a third station of the twelve stations, so as to identify the first angle θ0;

(4) obtaining a positional difference between an origin of the camera coordinate system and the origin of the table coordinate system as second difference coordinates (X0, Y0) in the table coordinate system using the first difference coordinates (X0, Y0), the first angle θ0, and a first equation, $$\begin{bmatrix} X_0 \\ Y_0 \end{bmatrix} = - \begin{bmatrix} \cos\theta_0 + \sin\theta_0 \\ -\sin\theta_0 + \cos\theta_0 \end{bmatrix} \begin{bmatrix} x_0 \\ y_0 \end{bmatrix};$$

(5) identifying first chip coordinates (X1, Y1) of one of the chips and a second angle θP of said one of the chips with respect to the X-axis in the camera coordinate system, said one of the chips being sucked by a second place nozzle of the place nozzles;

(6) transforming the first chip coordinates (X1, Y1) into second chip coordinates (X1, Y1) by means of a second equation, $$\begin{bmatrix} X_1 \\ Y_1 \end{bmatrix} = \begin{bmatrix} \cos\theta_0 + \sin\theta_0 \\ -\sin\theta_0 + \cos\theta_0 \end{bmatrix} \begin{bmatrix} x_1 \\ y_1 \end{bmatrix};$$

(7) obtaining thud coordinates (Xc, Yc) of said one of the chips in the table coordinate system by means of the second difference coordinates (X0, Y0), the second chip coordinates (X1, Y1), and a third equation, $$\begin{bmatrix} X_c \\ Y_c \end{bmatrix} = \begin{bmatrix} \cos\theta_0 + \sin\theta_0 \\ -\sin\theta_0 + \cos\theta_0 \end{bmatrix} \begin{bmatrix} x_1 \\ y_1 \end{bmatrix} - \begin{bmatrix} \cos\theta_0 + \sin\theta_0 \\ -\sin\theta_0 + \cos\theta_0 \end{bmatrix} \begin{bmatrix} x_0 \\ y_0 \end{bmatrix};$$

(8) obtaining distance coordinates (ΔX, ΔY) of the mount table by subtracting the third chip coordinates (Xc, Yc) from mount coordinates (Xm, Ym), and obtaining a rotation angle (Δθ) by subtracting the first angle (θ0) from the second angle (θP), the mount coordinates (Xm, Ym) being coordinates of a predetermined position on which said one of the chip is to be mounted in the table coordinate system; and (9) rotating the second place nozzle with the rotation angle (Δθ) when said one of the chips is located at a fifth station of the stations, and moving the mount table to the distance coordinates (ΔX, ΔY) in the table coordinate system while said one of the chips is travelling from at a sixth station to a seventh station of the stations, and then mounting said one of the chips onto the predetermined position on the printed circuit board when said one of the chips is located at a seventh station of the stations.

* * * * *